US008650598B2

(12) United States Patent
Shelby et al.

(10) Patent No.: US 8,650,598 B2
(45) Date of Patent: Feb. 11, 2014

(54) WIRELESS TRANSPORT FRAMEWORK WITH VARIABLE EQUALIZER TRAINING

(71) Applicant: Coherent Logix Incorporated, Austin, TX (US)

(72) Inventors: Kevin A. Shelby, Austin, TX (US); Peter J. Nysen, San Jose, CA (US); Michael B. Doerr, Dripping Springs, TX (US)

(73) Assignee: Coherent Logix, Incorporated, Austin, TX (US)

( * ) Notice: Subject to any disclaimer, the term of this patent is extended or adjusted under 35 U.S.C. 154(b) by 0 days.

(21) Appl. No.: 13/690,287

(22) Filed: Nov. 30, 2012

(65) Prior Publication Data

US 2013/0089131 A1    Apr. 11, 2013

Related U.S. Application Data

(63) Continuation of application No. 12/475,511, filed on May 30, 2009, now Pat. No. 8,347,339, which is a continuation-in-part of application No. 12/167,708, filed on Jul. 3, 2008, now Pat. No. 8,151,305.

(60) Provisional application No. 60/948,185, filed on Jul. 5, 2007, provisional application No. 60/958,585, filed on Jul. 5, 2007, provisional application No. 60/999,039, filed on Oct. 14, 2007, provisional application No. 61/130,344, filed on May 31, 2008.

(51) Int. Cl.
*H04N 7/16* (2011.01)

(52) U.S. Cl.
USPC .............................. 725/62; 375/231; 370/465

(58) Field of Classification Search
USPC .............................................. 725/62; 375/231
See application file for complete search history.

(56) References Cited

U.S. PATENT DOCUMENTS 5,933,768 A * 8/1999 Skold et al. .................. 455/296
6,125,147 A   9/2000 Florencio et al.
(Continued)

FOREIGN PATENT DOCUMENTS

| WO | 0203678 | 1/2002 |
| WO | 2007046677 | 4/2007 |
| WO | 2007/138283 | 12/2007 |

OTHER PUBLICATIONS

International Search Report and Written Opinion, PCT/US2009/045487, mailed Oct. 29, 2009, 17 pages.
(Continued)

*Primary Examiner* — Robert Hance
(74) *Attorney, Agent, or Firm* — Meyertons Hood Kivlin Kowert & Goetzel, P.C.; Jeffrey C. Hood

(57) ABSTRACT

A system and method for wirelessly transmitting audiovisual information. Training information may be stored in a memory. A plurality of packets may be generated, including the training information. The plurality of packets may also include audiovisual information. The plurality of packets may include first information identifying a first training pattern of a plurality of possible training patterns. The first training pattern may specify one or more locations of the training information in the plurality of packets. The first information may be usable by a receiver to determine the first training pattern of the plurality of possible training patterns. The plurality of packets may be transmitted in a wireless manner.

17 Claims, 5 Drawing Sheets

(56) References Cited

U.S. PATENT DOCUMENTS

| | | | |
|---|---|---|---|
| 6,560,321 B1* | 5/2003 | Chen et al. | 379/100.17 |
| 6,691,274 B1 | 2/2004 | Olds et al. | |
| 6,744,822 B1 | 6/2004 | Gaddam et al. | |
| 6,760,077 B2 | 7/2004 | Choi et al. | |
| 6,914,560 B2 | 7/2005 | Spilker, Jr. et al. | |
| 6,958,991 B1* | 10/2005 | Raaf | 370/348 |
| 7,092,906 B1* | 8/2006 | Campbell et al. | 705/50 |
| 7,206,352 B2 | 4/2007 | Birru et al. | |
| 7,280,835 B2* | 10/2007 | Usuda et al. | 455/450 |
| 7,337,386 B2 | 2/2008 | Chang et al. | |
| 7,801,184 B2* | 9/2010 | Paulson et al. | 370/510 |
| 2002/0168991 A1* | 11/2002 | Kochanski et al. | 455/505 |
| 2002/0176485 A1* | 11/2002 | Hudson | 375/144 |
| 2003/0207696 A1 | 11/2003 | Willenegger et al. | |
| 2004/0057535 A1 | 3/2004 | Strolle et al. | |
| 2004/0101046 A1 | 5/2004 | Yang et al. | |
| 2005/0058115 A1* | 3/2005 | Levin et al. | 370/344 |
| 2006/0092892 A1* | 5/2006 | Trachewsky | 370/338 |
| 2006/0244865 A1* | 11/2006 | Simon | 348/614 |
| 2006/0262651 A1 | 11/2006 | Cooper et al. | |
| 2007/0002734 A1 | 1/2007 | Kim et al. | |
| 2007/0064707 A1 | 3/2007 | Pandel et al. | |
| 2007/0064785 A1* | 3/2007 | Alapuranen | 375/224 |
| 2007/0081595 A1 | 4/2007 | Choi et al. | |
| 2007/0147440 A1 | 6/2007 | Song et al. | |
| 2007/0247395 A1 | 10/2007 | Barraclough et al. | |
| 2007/0286112 A1 | 12/2007 | Prakash et al. | |
| 2009/0193487 A1 | 7/2009 | Simon | |

OTHER PUBLICATIONS

Jill M. Boyce; "Packet loss resilient transmission of MPEG video over the Internet"; Signal Processing: Image Communication 15 (1999), pp. 7-24.

Mugen Peng and Wenbo Wang; "A Unified Architecture and Key Techniques for Interworking between WiMAX and Beyond 3G/4G Systems"; Oct. 2, 2007; pp. 67-90.

International Search Report and Written Opinion, PCT/US2009/045650, mailed Dec. 8, 2009, 16 pages.

"Annex D: RF/Transmission Systems Characteristics"; Digital Television Standard; XP-002187665; Sep. 16, 1995; 16 pages.

A. Touzni, H. Fu, M. Fimoff, and W. Bretl; "Enhanced 8-VSB Transmission for North-American HDTV Terrestrial Broadcast"; ICASSP 2003; Apr. 6, 2003; 4 pages.

International Search Report and Written Opinion; PCT/US2009/045763; Nov. 4, 2009; 15 pages.

O. Simeone and U. Spagnolini; "Adaptive Pilot Pattern for OFDM Systems"; IEEE Communications Society; 2004; pp. 978-982.

Yuze Zhang, Michael P. Fitz, and Saul B. Gelfand; A Performance Analysis and Design of Equalization with Pilot Aided Channel Estimation; IEEE; 1997; pp. 720-724.

Lingyun Cai, Youyun Xu, Hanwen Luo, Wentao Song, and Baoyu Zheng; "Cell Search Frequency Synchronization for Beyond 3G"; IEEE 6th CAS Symp. on Emerging Technologies: Mobile and Wireless Comm., Shanghai, China, May 31-Jun. 2, 2004; pp. 45-48.

Fumiaki Tsuzuki and Tomoaki Ohtsuki; "SAGE Algorithm for Channel Estimation and Data Detection Using Superimposed Training in Mimo System"; IEEE; 2006; 3 pages.

Fumiaki Tsuzuki and Tomoaki Ohtsuki; "Channel Estimation with Selective Superimposed Pilot Sequences Under Fast Fading Environments"; IEEE; 2004; pp. 62-66.

"ATSC Digital Television Standard Part 2—RF/Transmission System Characteristics (A/53, Part 2:2007)"; Advanced Television Systems Committee; Jan. 3, 2007; 44 pages.

"Modulation and Coding Requirements for Digital TV (DTV) Applications Over Satellite—ATSC Standard"; Advanced Television Systems Committee; Jul. 17, 1999; 33 pages.

\* cited by examiner

| Id | Code |
|---|---|
| 0 | 1101 0000 0001 1010 |
| 1 | 1001 1100 0101 0110 |
| 2 | 0110 1100 1010 0110 |
| 3 | 0010 0000 1110 1010 |
| 4 | 1111 0110 0011 1100 |
| 5 | 1011 1010 0111 0000 |
| 6 | 0100 1010 1000 0000 |
| 7 | 0000 0110 1100 1100 |
| 8 | 1000 1110 0100 0100 |
| 9 | 1100 0010 0000 1000 |
| 10 | 0011 0010 1111 1000 |
| 11 | 0111 1110 1011 0100 |
| 12 | 1010 1000 0110 0010 |
| 13 | 1110 0100 0010 1110 |
| 14 | 0001 0100 1101 1110 |
| 15 | 0101 1000 1001 0010 |

FIG. 4

| Id | Decription |
|---|---|
| 0 | Unused |
| 1 | Unused |
| 2 | Standard M/H Training all 6 training sequences available |
| 3 | remove Training B4.2, B6 (3$^{rd}$, 5th training sequences) |
| 4 | Unused |
| 5 | remove Training B4.2, B5 B6 (3rd, 4th, 5th training sequences) |
| 6 | remove (all) Training B3, B4.1, B4.2, B5, B6, B7 (1st, 2nd, 3rd, 4th, 5th, 6th training sequences) |
| 7 | Reserved |
| 8 | Reserved |
| 9 | Reserved |
| 10 | Reserved |
| 11 | Unused |
| 12 | Reserved |
| 13 | Reserved |
| 14 | Reserved |
| 15 | Unused |

FIG. 5 sion. One set of embodiments involves a system and method for wirelessly transmitting audiovisual information to a mobile device. Another set of embodiments involves a system and method for wirelessly receiving audiovisual information by a mobile device. The audiovisual information may be packetized according to the ATSC (Advanced Television Standards Committee) standard, e.g., using 8-VSB modulation The methods described below may be used for transmission to and/or reception by a mobile device of multimedia streams with a variable amount of training information. By using a system that allows for a variable amount of training information, the bandwidth allocation of training information vs. payload (e.g., audiovisual) information can be dynamically adjusted, depending on various factors. For example, as equalizer technology improves, a smaller amount of training information than is currently required may be sufficient to provide the same benefit for moving reception conditions, and some or all of the bandwidth that is currently dedicated to training information may be re-allocated to audiovisual information. Thus, the dynamic adjustment may occur over a longer period of time, e.g., as technology develops. Alternatively, the dynamic adjustment may be performed over a shorter time span; for example, during times of day when more receivers may be moving (e.g., during common commute times), more bandwidth may be allocated to training information than during times of day when stationary reception is more common (e.g., 'prime-time' or daytime).

The method for transmitting audiovisual information to a mobile device may include storing training information in a memory. A plurality of packets may be generated, a first portion of which may include the training information. The plurality of packets may also include audiovisual information. At least one packet of the plurality of packets may include first information which may identify a first training pattern of a plurality of possible training patterns. In one embodiment, the first information may be an orthogonal gold code, where each of a plurality of orthogonal gold codes correspond to each of the plurality of possible training patterns.

The first training pattern may specify one or more locations of the training information in the plurality of packets. The first training pattern may also specify which training information is being sent, e.g., if only a portion of the training information is being sent, and which training information is in which location in the plurality of packets. For example, each of the possible training patterns may specify a different amount and/or number of locations of training information in the plurality of packets. In one embodiment, one of the training patterns (e.g., the first training pattern) may specify that there is no training information in the plurality of packets.

The first information may be usable by the receiver to determine the first training pattern of the plurality of possible training patterns. The first information may be included together with control information for the plurality of packets. In one embodiment, the control information may make up its own subset of the plurality of packets. For example, the control information may be located in separate packets than the audiovisual information and/or the training information.

If not all of the locations in the plurality of packets that might be used for training information are specified by the first training pattern as containing training information, these locations may be used for audiovisual information instead of training information. In other words, if at least one of the plurality of possible training patterns specifies a first location of training information in the plurality of packets, and the first training pattern does not specify that the first location con-

WIRELESS TRANSPORT FRAMEWORK WITH VARIABLE EQUALIZER TRAINING

PRIORITY CLAIM

This application is a continuation of U.S. application Ser. No. 12/475,511 titled "Transmission of Multimedia Streams to Mobile Devices with Variable Training Information" filed on May 30, 2009, which is a continuation-in-part of U.S. application Ser. No. 12/167,708 titled "Mobile Television Broadcast System" filed on Jul. 3, 2008, which claims benefit of priority to provisional application Ser. No. 60/948,185 titled "Robust Mobile TV Broadcast System" filed Jul. 5, 2007, Ser. No. 60/958,585 titled "Robust Mobile TV Broadcast System" filed Jul. 5, 2007, and Ser. No. 60/999,039 titled "Robust Mobile TV Broadcast System" filed Oct. 14, 2007, all of which are hereby incorporated by reference in their entirety as though fully and completely set forth herein.

Ser. No. 12/475,511 claims benefit of priority to provisional application Ser. No. 61/130,344 titled "Enhanced Mobile TV System" filed on May 31, 2008, which is hereby incorporated by reference in its entirety as though fully and completely set forth herein.

FIELD OF THE INVENTION

The present invention relates to a mobile television broadcast system, and more specifically in one embodiment relates to enhancement of the current ATSC Digital TV broadcast system for mobile services to mobile and handheld devices.

DESCRIPTION OF THE RELATED ART

The ATSC (Advanced Television Systems Committee) standard relates to a digital television format which will replace the analog NTSC television system. The ATSC standard is a high definition television standard that produces standard 4:3 or wide screen 16:9 images up to 1920×1080 pixels in size—more than six times the display resolution of the earlier NTSC standard. The ATSC standard makes provisions to transport multiple standard-definition "virtual channels" broadcast on a single 6 MHz TV channel. The ATSC standard also includes "theater quality" audio using the Dolby Digital AC-3 format to provide 5.1-channel surround sound. The ATSC standard also provides numerous auxiliary datacasting services.

The ATSC standard uses the MPEG-2 systems specification for encapsulation (transport) of data. More specifically, ATSC uses the 188-byte MPEG transport stream packets to carry data. MPEG-2 is also referred to as "transport stream", "MPEG-TS", or simply "TS". At the receiver side, before decoding of audio and video occurs, the receiver demodulates and applies error correction to the signal. Then, the transport stream may be demultiplexed into its constituent streams. A video codec, e.g. MPEG-2, H.264, VC-1, is used for encoding and decoding video, subject to certain constraints.

Previously, mobile reception of digital television stations transmitted using the ATSC standard has been difficult to impossible. For example, mobile reception of digital television stations is very difficult when moving at vehicular speeds. Therefore, there is a need for an improved system and method for transmission and/or reception of digital television signals for improved mobile reception.

SUMMARY OF THE INVENTION

Various embodiments are presented of a system and method for wirelessly communicating audiovisual informatains training information, the first location in the plurality of packets may contain audiovisual information.

The plurality of packets may be transmitted in a wireless manner. Thus, the packets may be transmitted to a mobile device, e.g., including a receiver. The plurality of packets may be transmitted by a transmitter, e.g., including an antenna.

The method for wirelessly transmitting audiovisual information to a mobile device may be performed partially or entirely by a system, which in various embodiments may include some or all of: memory for storing the training information; transmit logic coupled to the memory and configured to generate the packets; and a transmitter for transmitting the pluralities of packets.

The method for wirelessly receiving and presenting audiovisual information by a mobile device may include storing training information in a memory. A plurality of packets, including a transmitted version of the training information, may be received in a wireless manner. The plurality of packets may also include audiovisual information. The plurality of packets may further include first information, which may be determined from at least one packet of the plurality of packets. The first information may be an orthogonal gold code, where each of a plurality of orthogonal gold codes correspond to each of a plurality of possible training patterns. The first information may identify a first training pattern of the plurality of possible training patterns.

The first training pattern may specify one or more locations of the training information in the plurality of packets. The first training pattern may also specify which training information is included in the plurality of packets, e.g., if only a portion of the training information is included, and which training information is in which location in the plurality of packets. For example, each of the possible training patterns may specify a different amount and/or number of locations of training information in the plurality of packets. In one embodiment, one of the training patterns (e.g., the first training pattern) may specify that there is no training information in the plurality of packets.

The first training pattern may be determined by the mobile device based on the first information. The mobile device may thereby determine the one or more locations of the transmitted version of the training information in the plurality of packets.

The first information may be included together with control information for the plurality of packets. In one embodiment, the control information may make up its own subset of the plurality of packets. For example, the control information may be located in separate packets than the audiovisual information and/or the training information.

If not all of the locations in the plurality of packets that might be used for training information are specified by the first training pattern as containing training information, these locations may be used for audiovisual information instead of training information. Thus, if at least one of the plurality of possible training patterns specifies a first location of training information in the plurality of packets, and the first training pattern does not specify that the first location contains training information, the mobile device may determine that the first location in the plurality of packets contains audiovisual information.

The mobile device may train the receiver using the transmitted version of the training information and the stored version of the training information. In other words, the mobile device may update an equalizer based on a comparison between the transmitted version and the stored version of the training information; this comparison may be useful in tracking moving reception conditions, and thus may improve the ability of the receiver to process and present the audiovisual information on the mobile device.

At least a portion of the audiovisual information may be presented on the mobile device. This may include presenting (e.g., displaying) video information on a display and/or presenting (e.g., playing) audio information on one or more speakers.

The method for wirelessly receiving audiovisual information by a mobile device may be performed by a mobile device. The mobile device may include an antenna for wirelessly receiving the packets, receiver logic coupled to the antenna for determining the training information used, for processing the audiovisual information, and presenting the processed audiovisual information, and a display and/or one or more speakers on which the audiovisual information may actually be presented.

BRIEF DESCRIPTION OF THE DRAWINGS

A better understanding of the present invention can be obtained when the following detailed description of the preferred embodiment is considered in conjunction with the following drawings, in which:

FIG. 4 is a table of 16 bit orthogonal gold codes according to one embodiment;

FIG. 5 is a table mapping the gold codes shown in FIG. 4 to training sequence patterns according to one embodiment.

Figure 1:
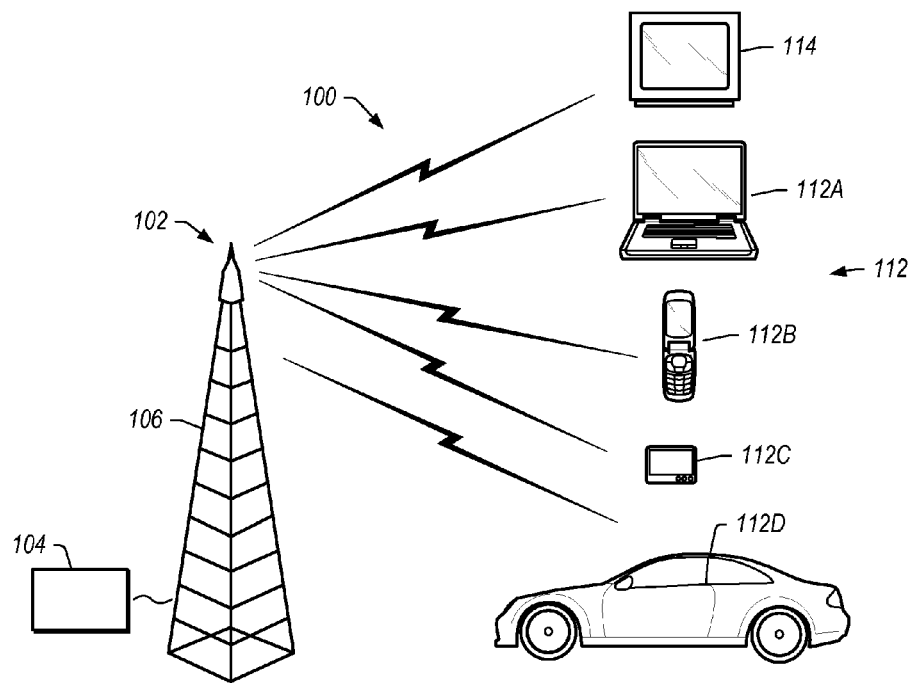
FIG. 1 illustrates a digital television broadcast system according to one embodiment.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

FIG. 1—Digital Television Broadcast System

FIG. 1 illustrates an exemplary broadcast system 100 according to one embodiment of the invention. In one embodiment, the broadcast system may be a digital television broadcast system. The broadcast system 100 described herein, including the various methods described herein, may be used for broadcasting any of various types of data, including audiovisual information as well as other data.

As used herein, the term "audiovisual information" includes any of various types of information or data that comprises video data and/or audio data. The term "video data" includes motion video (such as television, movies, streaming video, etc., as well as image data, such as JPEGs. The term "audiovisual information" further includes any of various types of information or program instructions that, when executed, cause a device to present video data (on a display) and/or audio data (on speakers). For example, the term "audiovisual information" includes any of various types of gaming content (including program instructions and/or data) that can be used and/or executed to present gaming content (e.g., images, video, and/or audio) on a presentation device.

The broadcast system 100 and the various methods described herein are described in the present application in the context of transmitting audiovisual information for presentation by a receiving device, in particular digital television. However, it is noted that the broadcast system 100 and the various methods described herein may be used for transmission/reception of any of various types of data (e.g., audiovisual information, email, files, text documents, seismic data, measurement data, weather data, etc.), with audiovisual information being merely one representative example.

In one set of embodiments, the broadcast system may operate according to the ATSC (Advanced Television Standards Committee) standard, e.g., using 8-VSB modulation. Alternatively, the broadcast system may operate according to a modified version of the ATSC standard, or according to another standard. For example, the Mobile/Handheld (M/H) modification of the ATSC standard is used for transmission of audiovisual information for moving receivers. The current M/H system transports M/H services in bursts alongside the main service stream encapsulated in NULL packets consistent with the methods prescribed for E-VSB service multiplexing. The system uses serial concatenated convolutional coding (SCCC) for additional robustness. To aid M/H reception, the existing M/H system supplements the base 8VSB transport with the addition of extra training multiplexed with the mobile packet data in such a way that the training data appears in contiguous bytes (2 full segments per training) at transmission. Thus, when it is available, a receiver can utilize this additional training information to update its equalizer in order to track fast moving channel conditions. Specific examples of the embodiments disclosed herein may be based on, or include portions of the M/H modification to the ATSC standard, and may also include further variations and modifications to M/H and the ATSC standard. However, the embodiments related to transmission of audiovisual information disclosed herein are not necessarily limited to use with the ATSC or M/H systems, and may be equally applicable for transmission of audiovisual information in accordance with other standards and/or modulations schemes, such as DVB-T/H, ISDB-T, DMB-T/H, etc.

As shown, the system 100 comprises a transmission system (or transmit system) 102, one or more mobile devices 112 (e.g., mobile devices 112A-112D), and at least one stationary device 114. As noted above FIG. 1 is exemplary only, e.g., an exemplary system may comprise one or more transmission systems 102, a plurality of mobile devices 112, and a plurality of stationary devices 114.

The transmission system 102 is configured to transmit audiovisual information to the one or more mobile devices 112 in a wireless manner. More particularly, the transmission system 102 may be configured to transmit digital television signals /channels to the mobile devices 112. The mobile devices 112 may receive and present the audiovisual information, e.g., receive and present the digital television signals/channels. The transmission system 102 may also be configured to transmit audiovisual information to the stationary device 114 (e.g., stationary television) in a wireless manner. The transmission system 102 may also be configured to transmit audiovisual information to the one or more stationary devices 114, e.g., televisions.

For the sake of convenience, embodiments of the invention are described herein with respect to reception by mobile devices 112. However, the various embodiments of the invention described herein may also of course be used for reception by stationary devices. Thus any of the various methods described herein may be utilized with either mobile devices 112 or stationary devices 114, or both, as desired.

The transmission system 102 comprises a transmitter 106 as well as transmit logic 104 coupled to the transmitter 106. The transmit logic 104 may comprise any of various types of logic, such as one or more computer systems (with accompanying software), digital logic, analog logic, programmable gate arrays, etc., or combinations thereof. The transmit logic 104 is adapted for receiving and/or storing audiovisual information (e.g., television data) and for generating packets containing the audiovisual information. The transmit logic 104 may generate packets according to any of various standards, such as the ATSC (Advanced Television Standards Committee) standard, e.g., using 8-VSB modulation. The transmission system 102 may use other modulation schemes, such as DVB-T/H, ISDB-T, DMB-T/H, etc. The transmit logic may also be adapted for generating error correction coding information. For example, the transmit logic may be configured to encode data with any of various types of error correction techniques, including (but not limited to): convolutional coding (such as trellis encoding), block coding (such as Reed-Solomon encoding), or other error correction techniques. The transmit logic may be configured to encode data with more than one error correction technique. The transmit logic 104 may also be configured to generate packets containing control information. In one embodiment, one or more of the digital television channels are intended for stationary receivers, such as televisions. One or more of the digital television channels may also be intended for mobile and/or handheld (M/H) (referred to collectively herein as "mobile") devices 112. In one embodiment, one or more of the digital television channels may be intended for either stationary receivers or mobile devices.

The transmit logic 104 may be configured to generate packets containing error correction coding information for digital television channels intended for mobile devices 112 (and possibly for all channels, e.g., channels intended for stationary devices 114 and/or mobile devices 112). For example, the transmit logic 104 may generate error correction coding information for audiovisual information, and may transmit the error correction coding information in a separate packet (or packets) than the audiovisual information, with another packet (or packets) containing control information for associating the error correction coding information with the audiovisual information. Thus, a receiver (such as a stationary receiver) which does not require or is not configured to use the error correction coding information may ignore the error correction coding information packet and simply receive the audiovisual information as a normal audiovisual stream, while a receiver (such as a mobile device) which does require additional error correction coding information and is configured to use the error correction coding information may associate the error correction coding information with the audiovisual information (e.g., based on the control information) and thereby achieve a more robust system. Furthermore, the control information can be used by the transmit logic 104 to generate and transmit new types of error correction coding that is usable by the receiver.

The transmit logic 104 may be configured to generate packets containing training information, e.g., for updating a receiver's equalizer in order to track fast moving channel conditions. For example, the transmit logic 104 (or a memory coupled to the transmit logic 104) may store a number of predefined training sequences. A mobile device may also store the same predefined training sequences, e.g., in a memory. The transmit logic 104 may include one or more of the training sequences in the generated packets at predefined locations in the packets. The transmit logic 104 may also include control information that indicates to a mobile device which training sequences are included in the packets, and where in the packets they may be found. Thus, the mobile device may be able to compare the transmitted/received training sequence(s) to the stored training sequence(s). For example, if the mobile device includes an equalizer, any differences between the received training sequences and the stored (reference) training sequences may allow the equalizer to adapt to the current receiving conditions, thereby improving reception (and thus presentation) of the audiovisual information in the packets.

The mobile devices 112 may be any of various types of devices, such as portable computer systems (laptops) 112A, wireless telephones 112B (e.g., Blackberrys, iphones, etc.), personal digital assistants 112C, television equipment 112D configured in vehicles, and other types of portable devices capable of displaying received audiovisual information.

The mobile devices 112 are configured to wirelessly receive (e.g., with an antenna) the packets transmitted by the transmitter 106. A respective mobile device 112 may also include receiver logic for processing the received audiovisual information, as well as a display for presenting video information and one or more speakers for presenting audio information. Thus each of the mobile devices 112 may include television-like capabilities for presenting received television channels as described herein.

The stationary devices 114 may be any of various types of devices that are intended to be placed at a fixed location (referred to as stationary or "non-mobile"), such as conventional televisions, e.g., liquid crystal displays (LCD displays), plasma displays, etc.

Figure 2:
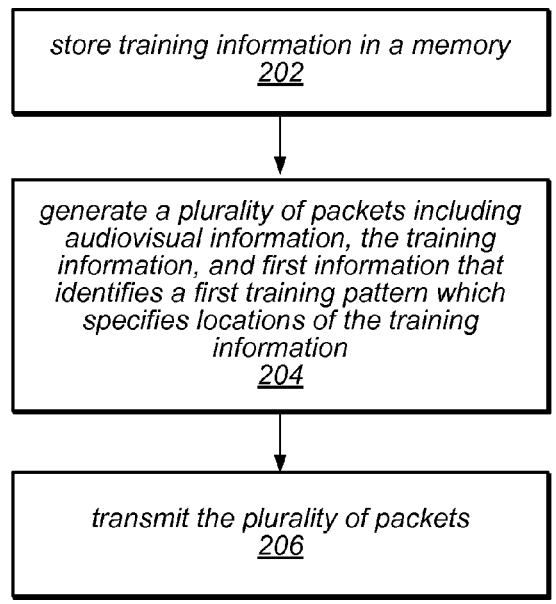
FIG. 2 is a flowchart diagram illustrating a method for wirelessly transmitting audiovisual information to a mobile device according to one embodiment.

FIG. 2—Transmit Flowchart

FIG. 2 is a flowchart depicting a method for transmitting audiovisual information. The method may be performed by a transmission system such as described above and shown in FIG. 1, e.g., a system including transmit logic and a transmitter. The audiovisual information may be for reception by mobile devices; alternatively, the audiovisual information may be for reception by stationary devices, or, both mobile and stationary devices. It should be noted that, according to various embodiments, one or more of the steps may be omitted, repeated, or performed in a different order than shown in FIG. 2 and described below.

The method may allow for a variable amount of training information to be transmitted with the audiovisual information. The training information may be used by an equalizer in a receiver in order to make adjustments for moving reception conditions. As reception conditions for a moving receiver may be continually changing, training information may be transmitted periodically, on a regular basis. A certain amount of training may be necessary for any given equalizer in order for the equalizer to be effective. As equalizer technology improves, however, it may be expected that the amount of training information necessary for an equalizer to do a satisfactory job of adapting to moving reception conditions will be reduced, or even eliminated (e.g., an equalizer may be able to 'train' on actual data). It may thus be desirable to re-allocate part or all of the bandwidth designated for training information to audiovisual information, in some cases. In other words, it may be desirable to implement a system which allows a variable amount of training information to be transmitted, such as described below.

In 202, training information may be stored in a memory. In one embodiment, the training information may be in the form of a number of training sequences. Each training sequence may be the same length as the other training sequences, e.g., spanning one or more field segments. In one embodiment, there may be six training sequences. Identical training information may also be stored on any intended receivers, e.g., mobile devices which are configured to receive the training information, in order to enable the receivers to use the training information to train their equalizers.

In 204, a plurality of packets, including audiovisual information, the training information, and first information that identifies a first training pattern which specifies locations of the training information, may be generated. In one embodiment, the packets may be generated according to the ATSC (Advanced Television Standards Committee) DTV (digital television) standard containing one or more digital television channels intended for stationary receivers (e.g., televisions); alternatively, or in addition, the packets may contain one or more digital television channels intended for mobile/handheld (M/H) receivers.

Generation of the packets containing audiovisual information may comprise various steps, such as encoding the audio and video data (e.g., using MPEG-2 encoding), applying forward error correction, generating appropriate packet headers and control information, etc. The forward error correction may take any number of forms, including Reed-Solomon (RS) encoding, Trellis encoding, cyclic redundancy codes (CRCs), or any other form of error correction coding, including a combination of multiple methods.

The training information may be located in the packets in specific locations. For example, there may be a number of training patterns, known to both the transmitter and the receiver, which define the use of specific training sequences and their locations within the packets. Thus, there might be a system with six training sequences, for which there might be a training pattern in which all six training sequences are used in the packets. There might also be a training pattern in which only four training sequences are used, or a training pattern in which no training sequences are included in the packets. Similarly, any number of training patterns may be defined, in which any of a variety of possible combinations of training sequences and locations within the packets are used.

Although any number of training patterns may be possible, in some embodiments it may be sufficient to define a few (e.g., three, four, six, etc) training patterns. For example, if there are six training sequences, there may be one pattern in which all six sequences are used, each in a particular location in the packets. There may also be patterns in which four, three, and zero training sequences are used, where each pattern uses the same locations in the packets for the training sequences that are used. Other sets of training patterns are also possible.

It should be noted that if a training pattern is used which does not specify that all of the possible training sequences be included in the packets, the locations which are not being used for training sequences (e.g., which might be used for training sequences in another training pattern) may be used for audiovisual information. In other words, by using a training pattern which includes less training information (e.g., fewer training sequences) than another training pattern, the location(s) which would otherwise be used for training information is freed up and may instead be used for additional audiovisual information. Said another way, decreasing the amount of training information used may allow additional audiovisual information to be sent, effectively reducing the bandwidth overhead dedicated to training information and increasing the bandwidth dedicated to payload (audiovisual information). Conversely, if additional training information is desirable, a training pattern which includes more training information (e.g., additional training sequences) may be chosen, albeit at the cost of reduced bandwidth for payload and increased bandwidth overhead.

There may be first information in the packets indicating which training pattern is being used. The first information may take any of a number of forms, as desired. In the ATSC M/H system, one possible way of signaling which training pattern is being used is to insert an orthogonal gold code (e.g., where each of that set of orthogonal gold codes is defined to indicate a particular training pattern) at the end of the field sync. More detail with regard to implementing this method in the ATSC M/H system is given below with respect to FIGS. 4 and 5. In general, the first information may be defined to indicate to a receiver that a particular training pattern is being used, regardless of how it is implemented.

The first information may be included in the plurality of packets as part of a subset of the plurality of packets which contains control information. For example, there may be control information for associating different audiovisual streams together, and/or for associating error correction coding information with one or more audiovisual streams, e.g., as described in application Ser. No. 12/472,892, titled "Transmission of Multimedia Streams to Mobile Devices With Cross Stream Association", which is hereby incorporated by reference in its entirety as though fully and completely set forth herein. Alternatively, or in addition, there may be control information indicating that a portion of the audiovisual information is part of an uncoded transport tunnel, e.g., as described in application Ser. No. 12/474,595, titled "Transmission of Multimedia Streams to Mobile Devices with Uncoded Transport Tunneling", which is hereby incorporated by reference in its entirety as though fully and completely set forth herein. Various other control information is also possible, either in addition to, or instead of, such control information. The control information may be in separate packets from the audiovisual information; although in some embodiments, it may also be possible to include part or all of the control information in the same packets as the audiovisual information.

In 206, the plurality of packets may be transmitted. Transmission of the plurality of packets may comprise multiplexing different subsets of the packets, for example, the packets making up the control stream (e.g., including the control information) may be multiplexed with the packets making up the audiovisual stream (e.g., including the audiovisual information). Multiplexing of these different packets or streams may be performed based on a ratio of the relative bandwidth allocations of the respective pluralities of packets (or streams). In one embodiment corresponding to continuous mode, multiplexing these different packet streams comprises ordering the packets to distribute them evenly according to their relative bandwidth. In another embodiment corresponding the burst mode, the different packet streams are aggregated in separate bursts preceded by control information (aggregated in its own burst) to indicate the start position of the remaining bursts. The multiplexing may operate to reduce transmission overhead. In one embodiment, the transmission method transmits size information regarding the bandwidth allocations of the various packet streams, wherein the size information is useable at the receiver to demultiplex the received packet streams.

Figure 3:
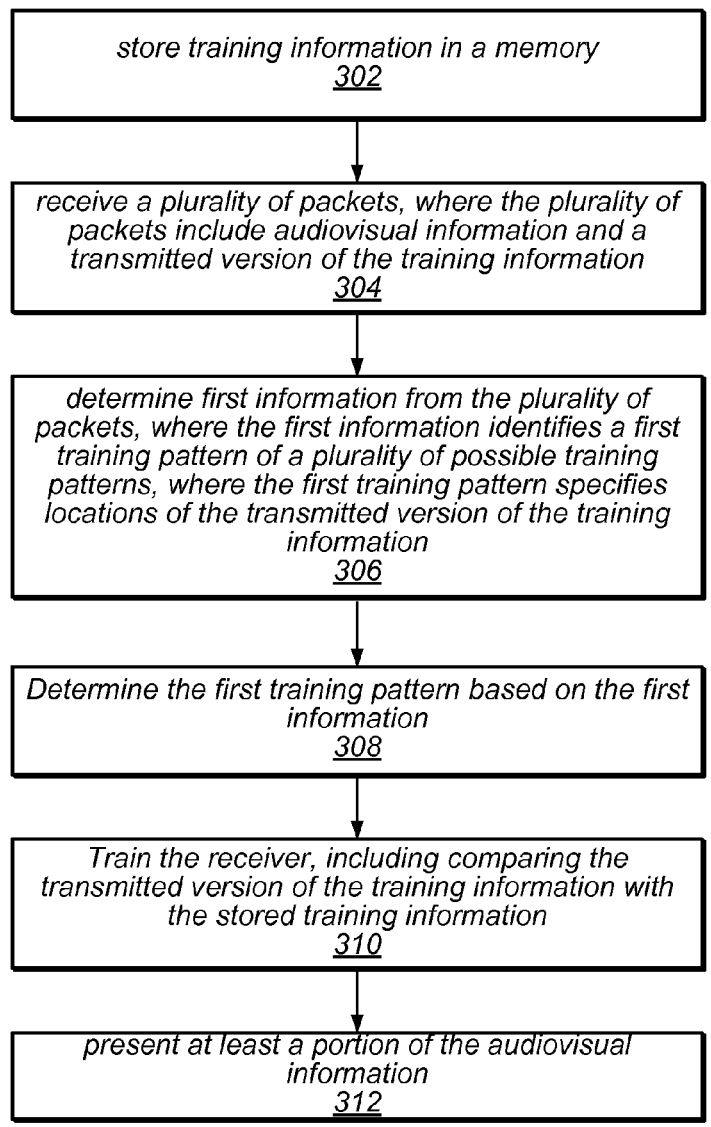
FIG. 3 is a flowchart diagram illustrating a method for a mobile device to wirelessly receive and present audiovisual information.

FIG. 3—Receive Flowchart

FIG. 3 is a flowchart depicting a method for receiving and presenting audiovisual information. The method may be performed by a mobile device such as described above and shown in FIG. 1, e.g., portable computer systems (laptops), wireless telephones (e.g., Blackberrys, iphones, etc.), personal digital assistants, television equipment configured in vehicles, and other types of portable devices capable of displaying received audiovisual information. Alternatively, in some embodiments, the method may be performed by a stationary device, such as also shown in FIG. 1 and described above, e.g., a conventional television, such as liquid crystal display (LCD display) television, a plasma display television, etc. It should be noted that, according to various embodiments, one or more of the steps may be omitted, repeated, or performed in a different order than shown in FIG. 2 and described below.

The method may allow the receiving device to receive a variable amount of training information with the audiovisual information. The receiving device may be able to use the training information to update its equalizer, e.g., in order to make adjustments for moving reception conditions. As reception conditions for a moving receiver may be continually changing, training information may be transmitted periodically, on a regular basis. A certain amount of training may be necessary for any given equalizer in order for the equalizer to be effective. As equalizer technology improves, however, it may be expected that the amount of training information necessary for an equalizer to do a satisfactory job of adapting to moving reception conditions will be reduced, or even eliminated (e.g., an equalizer may be able to 'train' on actual data). It may thus be desirable to re-allocate part or all of the bandwidth designated for training information to audiovisual information, in some cases. In other words, it may be desirable to implement a system which allows a variable amount of training information to be received, such as described below.

It should be noted that the method described below with respect to FIG. 3 may be used in combination with the method described above and illustrated by the flowchart in FIG. 2 (e.g., by a transmission system). Thus, many of the elements described below with respect to FIG. 3 may correspond to many of the elements described above with respect to FIG. 2, according to various embodiments.

In 302, training information may be stored in a memory. In 202, training information may be stored in a memory. In one embodiment, the training information may be in the form of a number of training sequences. Each training sequence may be the same length as the other training sequences, e.g., spanning one or more field segments. In one embodiment, there may be six training sequences. Identical training information may also be stored on any intended receivers, e.g., mobile devices which are configured to receive the training information, in order to enable the receivers to use the training information to train their equalizers.

In 304, a plurality of packets may be received. The plurality of packets may include audiovisual information and a transmitted version of the training information. The plurality of packets may also include first information that identifies a first training pattern which specifies locations of the training information in the plurality of packets. The packets may include one or more content streams intended for mobile and/or stationary devices. In one embodiment, the packets may be generated according to the ATSC (Advanced Television Standards Committee) DTV (digital television) standard containing one or more digital television channels intended for stationary receivers (e.g., televisions); alternatively, or in addition, the packets may contain one or more digital television channels intended for mobile/handheld (M/H) receivers. The packets containing audiovisual information may also include error correction coding, such as forward error correction; this may take any number of forms, including but limited to RS encoding, Trellis encoding, CRCs, or other forms of error correction coding, including a combination of multiple methods.

The training information may be located in the packets in specific locations. For example, there may be a number of training patterns, known to both the transmitter and the receiver, which define the use of specific training sequences and their locations within the packets. Thus, there might be a system with six training sequences, for which there might be a training pattern in which all six training sequences are used in the packets. There might also be a training pattern in which only four training sequences are used, or a training pattern in which no training sequences are included in the packets. Similarly, any number of training patterns may be defined, in which any of a variety of possible combinations of training sequences and locations within the packets are used.

Although any number of training patterns may be possible, in some embodiments it may be sufficient to define a few (e.g., three, four, six, etc) training patterns. For example, if there are six training sequences, there may be one pattern in which all six sequences are used, each in a particular location in the packets. There may also be patterns in which four, three, and zero training sequences are used, where each pattern uses the same locations in the packets for the training sequences that are used. Other sets of training patterns are also possible.

In 306, the first information may be determined from the plurality of packets. The first information may be included in the plurality of packets as part of a subset of the plurality of packets which contains control information. For example, there may be control information for associating different audiovisual streams together, and/or for associating error correction coding information with one or more audiovisual streams, e.g., as described in application Ser. No. 12/472,892, titled "Transmission of Multimedia Streams to Mobile Devices With Cross Stream Association", incorporated by reference above. Alternatively, or in addition, there may be control information indicating that a portion of the audiovisual information is part of an uncoded transport tunnel, e.g., as described in application Ser. No. 12/474,595 titled "Transmission of Multimedia Streams to Mobile Devices with Uncoded Transport Tunneling", incorporated by reference above. Various other control information is also possible, either in addition to, or instead of, such control information. The control information may be in separate packets from the audiovisual information; although in some embodiments, part or all of the control information may be included in the same packets as the audiovisual information.

As noted above, the first information may identify a first training pattern, which may be one of a plurality of possible training patterns. In other words, the first information in the packets may indicate which training pattern is being used. The first information may take any of a number of forms, as desired. In the ATSC M/H system, one possible way of signaling which training pattern is being used is to insert an orthogonal gold code (e.g., where each of that set of orthogonal gold codes is defined to indicate a particular training pattern) at the end of the field sync. More detail with regard to implementing this method in the ATSC M/H system is given below with respect to FIGS. 4 and 5. In general, the first information may be defined in such a way as to indicate to the receiver that a particular training pattern is being used, regardless of how it is implemented. That is to say, the first information may enable the receiver to determine the first training pattern, e.g., in step 308.

In 308, the first training pattern may be determined based on the first information. As described above, the first training pattern may be one of many possible training patterns. The training pattern may specify one or more training sequences that make up the training information, and the locations of the training sequences within the plurality of packets. Thus, the receiver may be able to identify the transmitted training information (e.g., the transmitted training sequences) for comparison with the stored training information (e.g., the stored training sequences), e.g., in step 310.

It should be noted that if a training pattern is used which does not specify that all of the possible training sequences be included in the packets, the locations which are not being used for training sequences (e.g., which might be used for training sequences in another training pattern) may be used for audiovisual information. In other words, by using a training pattern which includes less training information (e.g., fewer training sequences) than another training pattern, the location(s) which would otherwise be used for training information is freed up and may instead be used for additional audiovisual information. Said another way, if a lesser amount of training information is received, a corresponding additional amount of audiovisual information may be received, effectively reducing the bandwidth overhead dedicated to training information and increasing the bandwidth dedicated to payload (audiovisual information). Conversely, if additional training information is desirable, a training pattern which includes more training information (e.g., additional training sequences) may be chosen, albeit at the cost of reduced bandwidth for payload and increased bandwidth overhead.

In 310, the receiver may be trained, which may include comparing the transmitted version of the training information with the stored training information. The receiver may include an equalizer (e.g., an adaptive equalizer) which may help the receiver to process received audiovisual information in challenging receptions conditions. For example, the equalizer may be able to utilize the training information to determine adjustments to make to the received signal during processing which may improve the quality (e.g., the signal to noise ratio) of the received signal. According to various embodiments, the equalizer used may be any kind of equalizer, and the specific techniques for which the training information is used may be any equalizer techniques as known in the art.

In 312, at least a portion of the audiovisual information may be presented. Depending on the mobile device (e.g., legacy or late model) and the broadcast system (e.g., how many channels/services and what type/version of channels/services), at least a portion of the audiovisual information may be suitable for presentation at the mobile device. Part (e.g., the audiovisual information which is suitable for presentation) or all of the audiovisual information may in some embodiments also be processed before presentation. Processing the audiovisual information may include performing the inverse of any steps taken in preparing the data for transmission and/or packetizing the data, e.g., demultiplexing the data, decoding any error correction information, decoding the audio and video data, etc. Presenting the audiovisual information may include presenting video information on a display and/or presenting audio information on one or more speakers.

FIG. 4—16 Bit Orthogonal Gold Codes

FIG. 4 is a table listing a set of 16 bit orthogonal gold codes based on (poly=031, 027). As noted above with respect to FIGS. 2 and 3, in some embodiments, orthogonal gold codes may be used to signal which training pattern is being used, e.g., the first information may be an orthogonal gold code. In particular, these embodiments may be suitable for the ATSC M/H system, although they may also be partially or entirely applicable to other systems.

In one embodiment, the method of signaling variable length training patterns may use the orthogonal gold codes (length 16) in the field sync. These are the orthogonal gold codes shown in FIG. 4. These codes may be placed as the last 16 symbols of the 82 reserved symbols where the PN127 is placed in the MPH standard. Proximity to a PN511 may maximize the reliability of this signaling. In addition, the sequences can be averaged, further improving robustness. According to some embodiments, it may be assumed that the code will be inverted in on odd field periods, e.g., to adhere to the methodology specified by the M/H system. This method may allow the detection of 16 different states for a training sequence. Cutting the partial PN127 sequence from 82 to 66 symbols may have a negligible impact on the performance of detecting the field state (odd/even).

In order to implement the methods described above with respect to FIGS. 2 and 3 in the ATSC M/H system, other modifications to the system may be necessary. For example, in order to place audiovisual information in a location which might otherwise include training information, a modification to the M/H Group format organizer in the Group formatter may be necessary, e.g., to reallocate training locations as M/H data locations. In this way, block processing may be extended into these newly available segments.

In addition, depending on the training pattern being used, the SOBL value may be redefined to add the extra symbols into the desired blocks. This may also redefine the number of SCCC payload bytes per a group (PL). Since the MPH system already contains a method to adapt to the varying block sizes, adding to the value of PL may not require changes in the block encoder, just the way it calculates the PL and SOBL sizes.

The bolded entries in FIG. 4 show codes that have weak autocorrelation properties, which it may be preferable to avoid in using to signal a training pattern. A 16 length code may be used due to the lower detection threshold and the weak auto-correlation properties it contains, which may thereby reduce the effect of inter-symbol interference; however, other length codes may be used as desired. In this embodiment, although 16 codes are possible, five codes (i.e., the bolded entries) may be omitted for addition robustness, leaving 11 codes.

FIG. 5—Mapping of Gold Codes to Training Sequence Patterns

FIG. 5 is a table listing an exemplary mapping of the gold codes shown in FIG. 4 to several possible training sequence patterns according to one embodiment. In this exemplary embodiment, codes 0, 1, 4, 11, and 15 are not used due to weak autocorrelation properties, as noted above with respect to FIG. 4. Code 2 indicates that all six training sequences may be used, e.g., the standard M/H training Code 3 indicates that two (the third and fifth) training sequences may be removed. Code 5 indicates that three (the third, fourth, and fifth) training sequences may be removed. Code 6 indicates that all of the training sequences may be removed, i.e., that no training information may be included in the plurality of packets. The remainder of the codes may be reserved for other uses, such as additional training patterns, which may be defined at a future time. Thus, each of a plurality of training patterns may indicate a different amount of training information, each of a plurality of orthogonal gold codes (e.g., first information) may be defined to indicate a particular training pattern of the plurality of training patterns.

It should again be noted that while the exemplary embodiments described above implementing the methods described with respect to FIGS. 2 and 3 may particularly relate to the ATSC M/H system, they may similarly be used in any number of other systems. Similarly, although the methods described above with respect to FIGS. 2 and 3 may be implemented as described with respect to FIGS. 4 and 5, they may also or alternatively be implemented in any number of other ways, and should not be considered as limited to these exemplary implementations.

Figure 6:
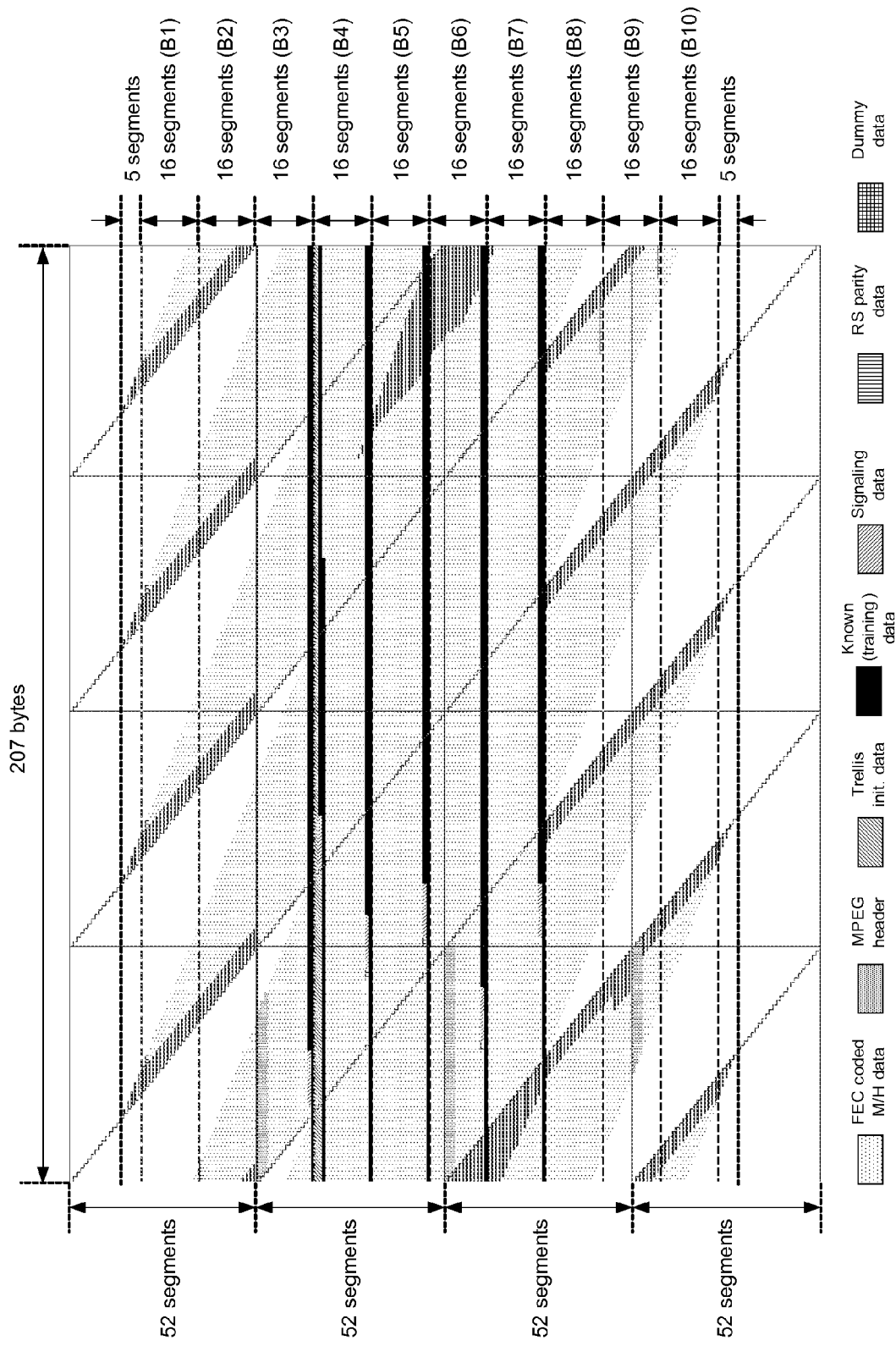
FIG. 6 depicts one embodiment of a M/H frame format as seen after byte interleaving.

FIG. 6 depicts one embodiment of a M/H frame format as seen after byte interleaving. A field segment may contain audiovisual information, forward error correction coding, known training symbols or "null" data. The M/H system distributes training information to multiple field segments. The standard training specifies 6 training sequences per field, each spanning one or more field segments. The revised training patterns remove the sequences in groups to preserve an even distribution among the remaining training sequences in the field.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A method for wirelessly transmitting content to mobile devices, the method comprising:
    storing a plurality of equalizer training sequences in a memory;
    selecting a training pattern, wherein the training pattern specifies equalizer training sequences of the plurality of equalizer training sequences for inclusion in a plurality of packets and locations in the plurality of packets for the specified equalizer training sequences, wherein the training pattern is selected from a plurality of possible training patterns, wherein each of the plurality of possible training patterns comprises a different amount of training information, wherein the training pattern is selected based on training needs of equalizer technology of the mobile devices;
    generating a plurality of packets using the selected training pattern, wherein the plurality of packets comprise content and control information, wherein the control information comprises an indication of the training pattern used in the plurality of packets; and
    transmitting the plurality of packets in a wireless manner,
    wherein selecting the training pattern comprises selecting a training pattern which specifies a lesser amount of training information for improved equalizer technology or selecting a training pattern which specifies a greater amount of training information for older equalizer technology.

2. The method of claim 1,
    wherein a first training pattern of the plurality of possible training patterns specifies that no equalizer training sequences be included in the plurality of packets, wherein a second training pattern of the plurality of possible training patterns specifies that a plurality of training sequences be included in the plurality of packets.

3. The method of claim 1,
    wherein if the selected training pattern specifies fewer than a maximum number of training sequences, one or more locations in the plurality of packets allocated for equalizer training sequences according to at least one training pattern comprise content.

4. The method of claim 1,
wherein the equalizer training sequences are configured for updating a receiver's equalizer to track fast moving channel conditions.

5. The method of claim 1,
wherein the indication of the training pattern comprises an orthogonal gold code, wherein each of a plurality of orthogonal gold codes correspond to each of the plurality of possible training patterns.

6. A system for generating packets configured for wireless transmission to mobile devices, the system comprising:
a memory, wherein a plurality of equalizer training sequences are stored in the memory; and
transmit logic operatively coupled to the memory, wherein the transmit logic is configured to:
select a training pattern, wherein the training pattern specifies equalizer training sequences of the plurality of equalizer training sequences for inclusion in a plurality of packets and locations in the plurality of packets for the specified equalizer training sequences, wherein the training pattern is selected from a plurality of possible training patterns, wherein each of the plurality of possible training patterns comprises a different amount of training information, wherein the training pattern is selected based on training needs of equalizer technology of the mobile devices; and
generate a plurality of packets using the selected training pattern, wherein the plurality of packets comprise content and control information,
wherein the control information comprises an indication of the training pattern used in the plurality of packets,
wherein the plurality of packets are configured to be transmitted in a wireless manner,
wherein selecting the training pattern comprises selecting a training pattern which specifies a lesser amount of training information for improved equalizer technology or selecting a training pattern which specifies a greater amount of training information for older equalizer technology.

7. The system of claim 6,
wherein the plurality of possible training patterns comprise training patterns that specify 0, 2, 3, 4, or 6 equalizer training sequences be included in the plurality of packets.

8. The system of claim 6,
wherein a first training pattern comprises a maximum number of training sequences, wherein if the selected training pattern specifies fewer than the maximum number of training sequences, one or more locations in the plurality of packets allocated for equalizer training sequences according to the first training pattern comprise content.

9. A non-transitory computer accessible memory medium, wherein a plurality of equalizer training sequences are stored in the memory, wherein the memory medium stores program instructions for generating packets configured for wireless transmission to mobile devices, wherein the program instructions are executable to:
select a training pattern, wherein the training pattern specifies equalizer training sequences of the plurality of equalizer training sequences for inclusion in a plurality of packets and locations in the plurality of packets for the specified equalizer training sequences, wherein the training pattern is selected from a plurality of possible training patterns, wherein each of the plurality of possible training patterns comprises a different amount of training information, wherein the training pattern is selected based on training needs of equalizer technology of the mobile devices; and
generate a plurality of packets using the selected training pattern, wherein the plurality of packets comprise content and control information,
wherein the control information comprises an indication of the training pattern used in the plurality of packets,
wherein the plurality of packets are configured to be transmitted in a wireless manner,
wherein selecting the training pattern comprises selecting a training pattern which specifies a lesser amount of training information for improved equalizer technology or selecting a training pattern which specifies a greater amount of training information for older equalizer technology.

10. A method for receiving and presenting content wirelessly received at a mobile device, the method comprising:
storing a plurality of reference equalizer training sequences in a memory;
receiving a plurality of packets in a wireless manner, wherein the plurality of packets comprise content and control information, wherein a plurality of locations in the plurality of packets are allocated for equalizer training sequences,
wherein the control information comprises an indication of a training pattern used in the plurality of packets, wherein the training pattern specifies which of a plurality of equalizer training sequences are included in the plurality of packets and which of the locations in the plurality of packets allocated for equalizer training sequences are used for those of the plurality of equalizer training sequences which are included in the plurality of packets, wherein the training pattern is selected by a transmitter based on training needs of equalizer technology of the mobile device;
identifying the training pattern based on the indication of the training pattern;
training an equalizer of the mobile device, comprising comparing equalizer training sequences received in the plurality of packets to corresponding reference equalizer training sequences of the plurality of reference equalizer training sequences stored in the memory; and
processing at least a portion of the plurality of packets using the trained equalizer,
wherein the training pattern is selected from a plurality of possible training patterns, wherein a training pattern which specifies a lesser amount of training information is selected for improved equalizer technology, wherein a training pattern which specifies a greater amount of training information is selected for older equalizer technology.

11. The method of claim 10, further comprising:
presenting at least a portion of the content comprised in the plurality of packets on the mobile device;
wherein locations in the plurality of packets allocated for equalizer training sequences which are not used for equalizer training sequences according to the training pattern comprise content.

12. The method of claim 10,
wherein training the equalizer using the received equalizer training sequences updates the mobile device's equalizer to track fast moving channel conditions.

13. The method of claim 10,
wherein the indication of the training pattern comprises an orthogonal gold code, wherein each of a plurality of orthogonal gold codes correspond to each of a plurality of possible training patterns.

14. The method of claim 10, wherein the content comprises audiovisual information, the method further comprising:
presenting the audiovisual information on one or more of a display and a speaker.

15. A system for processing packets wirelessly received at a mobile device, the system being for use in the mobile device, the system comprising:
a memory for storing a plurality of reference equalizer training sequences;
an input for receiving a plurality of packets, wherein the plurality of packets were transmitted in a wireless manner, wherein the plurality of packets comprise content and control information, wherein a plurality of locations in the plurality of packets are allocated for equalizer training sequences,
wherein the control information comprises an indication of a training pattern used in the plurality of packets, wherein the training pattern specifies which of a plurality of equalizer training sequences are included in the plurality of packets and which of the locations in the plurality of packets allocated for equalizer training sequences are used for those of the plurality of equalizer training sequences which are included in the plurality of packets, wherein the training pattern is selected by a transmitter based on training needs of equalizer technology of the system; and
receiver logic operatively coupled to the memory and the input, wherein the receiver logic is configured to
identify the training pattern based on the indication of the training pattern;
train an equalizer of the system, comprising comparing equalizer training sequences received in the plurality of packets to corresponding reference equalizer training sequences of the plurality of reference equalizer training sequences stored in the memory; and
process at least a portion of the plurality of packets using the trained equalizer,
wherein the training pattern is selected from a plurality of possible training patterns, wherein a training pattern which specifies a lesser amount of training information is selected for improved equalizer technology, wherein a training pattern which specifies a greater amount of training information is selected for older equalizer technology.

16. The system of claim 15,
wherein locations in the plurality of packets allocated for equalizer training sequences which are not used for equalizer training sequences according to the training pattern comprise content.

17. A non-transitory computer accessible memory medium, wherein a plurality of reference equalizer training sequences are stored on the memory medium, wherein the memory medium stores program instructions for a mobile device to process wirelessly received packets, wherein the program instructions are executable to:
receive a plurality of packets, wherein the plurality of packets comprise content and control information, wherein a plurality of locations in the plurality of packets are allocated for equalizer training sequences,
wherein the control information comprises an indication of a training pattern used in the plurality of packets, wherein the training pattern specifies which of a plurality of equalizer training sequences are included in the plurality of packets and which of the locations in the plurality of packets allocated for equalizer training sequences are used for those of the plurality of equalizer training sequences which are included in the plurality of packets, wherein the training pattern is selected by a transmitter based on training needs of equalizer technology of the mobile device;
identify the training pattern based on the indication of the training pattern;
train an equalizer, comprising comparing equalizer training sequences received in the plurality of packets to corresponding reference equalizer training sequences of the plurality of reference equalizer training sequences stored in the memory; and
process at least a portion of the plurality of packets using the trained equalizer,
wherein the training pattern is selected from a plurality of possible training patterns, wherein a training pattern which specifies a lesser amount of training information is selected for improved equalizer technology, wherein a training pattern which specifies a greater amount of training information is selected for older equalizer technology.

* * * * *